United States Patent
Chong et al.

(10) Patent No.: US 8,582,340 B2
(45) Date of Patent: Nov. 12, 2013

(54) WORD LINE AND POWER CONDUCTOR WITHIN A METAL LAYER OF A MEMORY CELL

(75) Inventors: Yew Keong Chong, New Braunfels, TX (US); Gus Yeung, Austin, TX (US)

(73) Assignee: ARM Limited, Cambridge (GB)

( * ) Notice: Subject to any disclaimer, the term of this patent is extended or adjusted under 35 U.S.C. 154(b) by 10 days.

(21) Appl. No.: 13/348,838

(22) Filed: Jan. 12, 2012

(65) Prior Publication Data

US 2013/0182484 A1    Jul. 18, 2013

(51) Int. Cl.
*G11C 5/06* (2006.01)
(52) U.S. Cl.
USPC ............. 365/63; 365/226; 365/72; 257/207; 257/208; 257/211; 257/758
(58) Field of Classification Search
USPC ............................................. 365/63, 72, 226
See application file for complete search history.

(56) References Cited

U.S. PATENT DOCUMENTS

| | | | | |
|---|---|---|---|---|
| 6,788,561 B2 * | 9/2004 | Watanabe et al. | | 365/63 |
| 6,831,294 B1 * | 12/2004 | Nishimura et al. | | 257/48 |
| 7,006,370 B1 * | 2/2006 | Ramesh et al. | | 365/63 |
| 7,365,432 B2 * | 4/2008 | Liaw | | 257/758 |
| 7,592,649 B2 * | 9/2009 | Chung et al. | | 257/208 |
| 7,683,419 B2 * | 3/2010 | Akiyama et al. | | 257/311 |
| 7,834,337 B2 * | 11/2010 | Takaura et al. | | 257/2 |

* cited by examiner

*Primary Examiner* — Viet Q Nguyen
(74) *Attorney, Agent, or Firm* — Nixon & Vanderhye P.C.

(57) ABSTRACT

A memory cell 6 includes a M3 metal layer which incorporate continuous word lines 12 and power conductors formed of a plurality of separate power line sections 14 running parallel to the word lines. Interstitial gaps between the separate power line sections are larger in size than the power line sections themselves. The power line sections are disposed in a staggered arrangement either side of the word lines.

17 Claims, 5 Drawing Sheets

M1 layer

WL width increase
opposite interstitial gaps

M2 layer, M3 layer and Via 23

WORD LINE AND POWER CONDUCTOR WITHIN A METAL LAYER OF A MEMORY CELL

BACKGROUND OF THE INVENTION

1. Field of the Invention

This invention relates to the field of memory cell layouts. More particularly, this invention relates to the layout of word lines and power conductors within a metal layer of a memory cell.

2. Description of the Prior Art

It is known to provide memory cells which include multiple metal layers. As process geometries shrink, such as to 20 nm, various problems arise that were not encountered in larger process geometries. One example is the constraint upon minimum via spacing. One way of addressing this is to move the word lines into the M1 or M2 layers. However, a problem with this approach is that it results in a larger RC value associated with the word lines and this slows down memory accesses and memory cycle times. Furthermore, the increase in the RC of the memory line will also increase the power consumed and the area of the memory if it is necessary to buffer the word line.

SUMMARY OF THE INVENTION

Viewed from one aspect the present invention provides a memory cell for storing one of more bits of data, said memory bit cell comprising:
a substrate; and
a sequence of metal layers disposed over said substrate, said sequence including at least a first metal layer disposed over and proximal to said substrate, a second metal layer disposed over and proximal to said first metal layer and one or more further metal layers disposed over said second metal layer; wherein
said one or more further metal layers includes a subject metal layer, said subject metal layer including:
a word line configured to carry a word line signal for controlling access to said memory cell, said word line extending continuously across said memory bit cell; and
power supply conductors configured to supply electrical power to said memory cell, said power supply conductors having a plurality of separate power line sections disposed along a line spaced from and parallel to said word line.

The present technique employs word lines within the M3 or higher metal layers forming the memory cell. Furthermore, the power conductors within the layer containing the word lines and forming part of the power grid are depopulated so as to reduce the capacitive coupling between the word line and the power conductors. Furthermore, the interstitial gaps between the separate power line sections permit the word lines to be widened in areas adjacent those interstitial gaps thereby reducing the resistance of the word lines. The overall effect is to reduce the RC value associated with the word lines thereby increasing the speed of operation of the memory cell and reducing the power consumed by the memory cell.

The subject metal layer which contains the word line or word lines and the power conductors associated with the memory cell may be at the third metal layer or a higher metal layer. Overall routing congestion within an integrated circuit employing the memory cell of the present technique may be reduced if the subject metal layer is the third metal layer.

It will be appreciated in general that a memory cell may be composed of many different layers in accordance with the normal manufacturing techniques associated with integrated circuits and memory cells. Only some of these layers are metal layers.

The sequence of metal layers may include a further metal layer proximal to the subject metal layer and including a plurality of continuous power lines disposed perpendicular to the word line and the plurality of separate power line sections. Each of the power line sections may be electrically connected to the plurality of continuous power lines within the further metal layer. Thus, the further metal layer provides part of the power grid feeding in to the power conductors of the subject metal layer.

In the above context, the further metal layer may be the fourth metal layer so as to reduce the total height of the memory cell and open up higher level metal layers for other routing purposes within an integrated circuit employing the memory cell in accordance with the present techniques.

The separate power line sections disposed along the line are separated by interstitial gaps and the word line may be formed to have a width perpendicular to the line of the separate power line sections that is greater adjacent to the interstitial gaps than adjacent the plurality of separate word lines. Widening of the word lines adjacent the interstitial gaps in this way may be by design or may be performed automatically by the mask generating tools which generate the masks for manufacturing memory cell based upon a memory cell design layout using the present techniques.

The reduction in the RC value associated with the word line may be increased when the interstitial gaps within the power conductors are longer than the separate power line sections.

In some embodiments a memory comprising a plurality of memory cells in accordance with the above includes a plurality of word lines interleaved with a plurality of lines of power line sections. In this context the plurality of power line sections are disposed such that power line sections adjacent to first side of a given word line are disposed opposite interstitial gaps between power line sections adjacent a second side of said given word line. In this way, the provision of the separate power line sections is staggered on each side of a word line so as to facilitate the widening of the word line and an associated reduction in the resistance of that word line.

The memory cell may comprise a two-by-two array of bit cells, each bit cell storing one data bit. This facilitates the provision of vias extending between the second metal layer and the third metal layer in an interleaved arrangement whereby the via are disposed offset from and on alternating sides of a line extending between three or more nearest neighbours among said vias. This helps avoid the constraints arising due to the minimum via-to-via spacing in processing geometries below 22 nm.

Viewed from another aspect the present invention provides a method of manufacturing a memory cell for storing one of more bits of data, said method comprising the steps of:
forming a substrate; and
forming a sequence of metal layers disposed over said substrate, said sequence including at least a first metal layer disposed over and proximal to said substrate, a second metal layer disposed over and proximal to said first metal layer and one or more further metal layers disposed over said second metal layer; wherein
said one or more further metal layers includes a subject metal layer, said subject metal layer including:
a word line configured to carry a word line signal for controlling access to said memory cell, said word line extending continuously across said memory bit cell; and
power supply conductors configured to supply electrical power to said memory cell, said power supply conductors having of a plurality of separate power line sections disposed along a line spaced from and parallel to said word line.

Viewed from a further aspect the present invention provides a cell library stored in a non-transitory computer readable form for controlling a computer program, such as an electronic design automation tool, executed by a general purpose computer to generate one or more masks for manufacturing a memory cell as set out above.

The above, and other objects, features and advantages of this invention will be apparent from the following detailed description of illustrative embodiments which is to be read in connection with the accompanying drawings.

DESCRIPTION OF THE EMBODIMENTS

Figure 1:
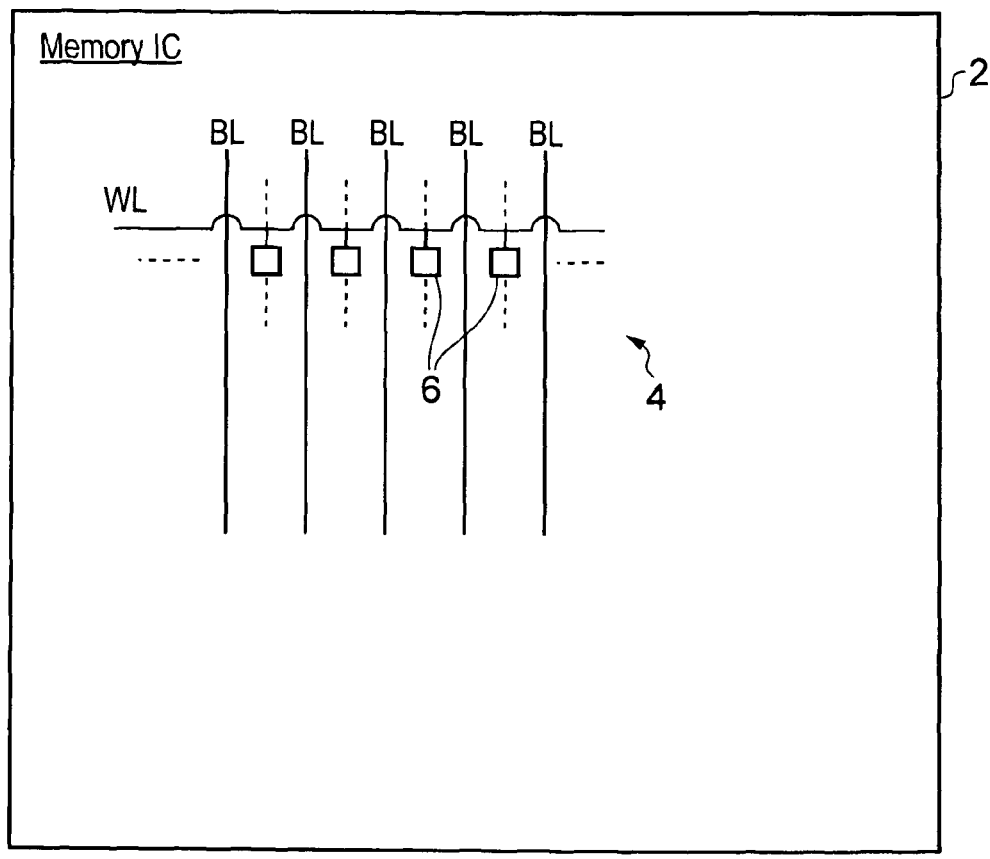
FIG. 1 schematically illustrates an integrated circuit containing an array of memory cells.

FIG. 1 illustrates an integrated circuit 2 including an array of memory cells 4. Each memory cell 6 within a row of memory cells is connected to a word line WL running across the array. Bit lines BL running perpendicular to the word lines WL are used to read bit values from the memory cells 6 and write values to the memory cells 6. It will be appreciated that in practice, the array 4 is a two-dimensional array that may contain a large number of memory cells necessary to provide a memory of high capacity.

Figure 2:
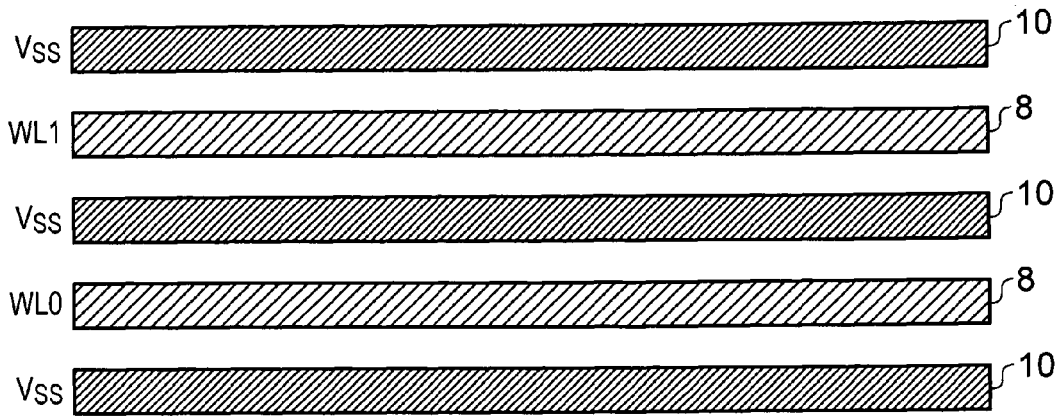
FIG. 2 schematically illustrates a metal layer including continuous power line conductors and continuous word lines.

FIG. 2 illustrates a possible prior art metal layer within the memory cells 6. This metal layer includes continuous word lines 8 running across the memory cells and continuous power conductors 10 parallel to the word lines 8 and also running across the memory cells. A problem with this approach is the relatively high capacitive coupling between the word lines 8 and the power conductors 10 which results in a high RC value for the word lines and slow operation of the memory cells.

Figure 3:
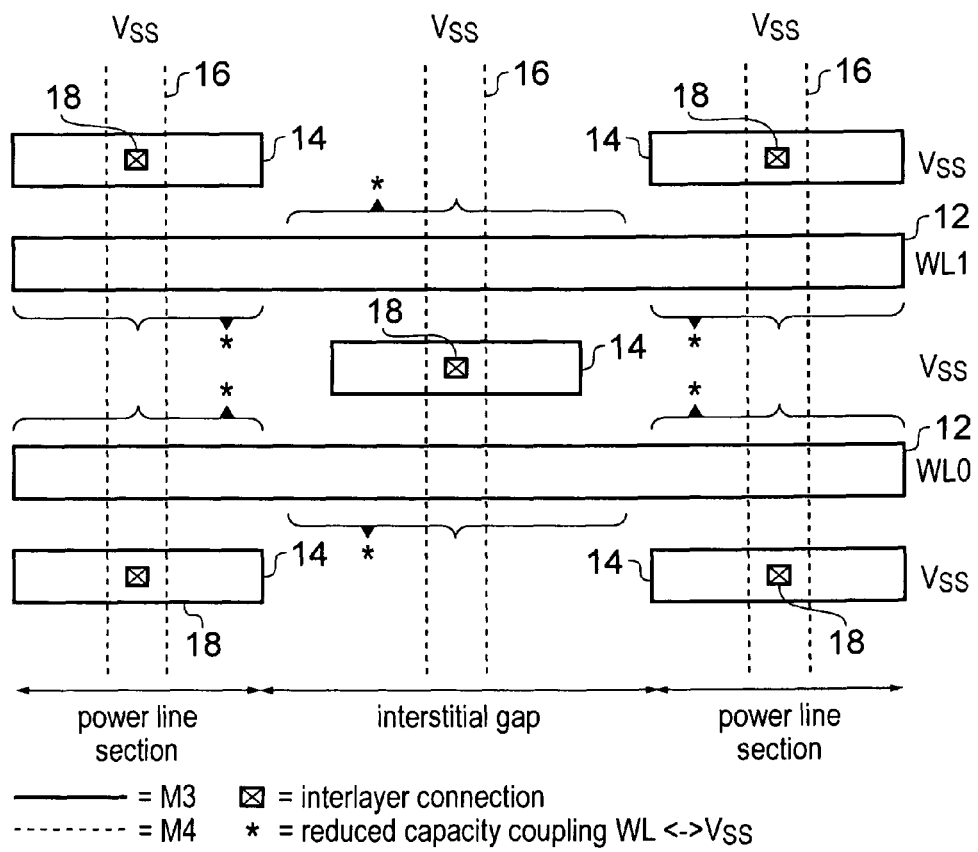
FIG. 3 schematically illustrates an M3 and an M4 metal layer using continuous word lines and separate power line sections within the M3 layer.

FIG. 3 schematically illustrates the M3 and M4 metal layers within a memory cell in accordance with one example embodiment of the present technique. The shapes illustrated with the solid lines are formed in the M3 layer. The shapes illustrated with the dashed lines are formed within the M4 metal layer. The M3 metal layer contains continuous word lines 12 running across the memory cell. Parallel to the word lines 12, and within the same M3 layer, are disposed a plurality of separate power line sections 14. Each of these power line sections 14 lies on a power line that is parallel with the word lines 12. Between the individual power line sections 14 are disposed interstitial gaps. These interstitial gaps are larger than the power line sections themselves. The plurality of power line sections 14 are interleaved with the word lines 12. The power lines section 14 are disposed in a staggered arrangement relative to each other such that a power line section 14 adjacent to one side of a word line 12 is opposite an interstitial gap on the other side of that word line 12.

An M4 metal layer is disposed over the M3 metal layer. The M4 metal layer contains continuous power lines 16 running in a direction perpendicular to both the word lines 12 and the power line sections 14. The continuous power lines 16 are connected with inter-layer connections 18 to the power line sections 14 within the M3 metal layer which they overlie.

It will be seen in FIG. 3 that the interstitial gaps within the power conductors of the M3 layer provide additional space around the word lines and serve to reduce the capacitive coupling between the power line sections 14 and the word lines 12.

Figure 4:
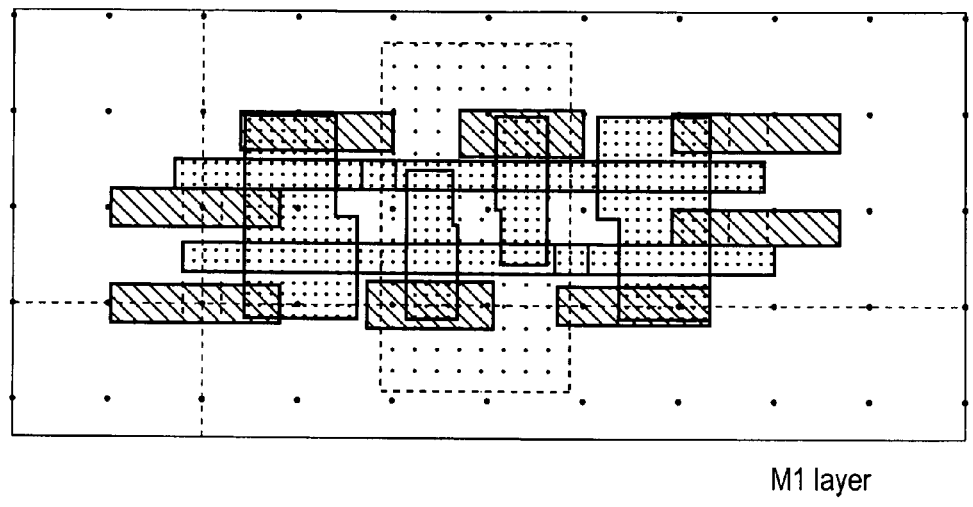
FIG. 4 schematically illustrates the M1 layer within a memory cell.
Figure 5:
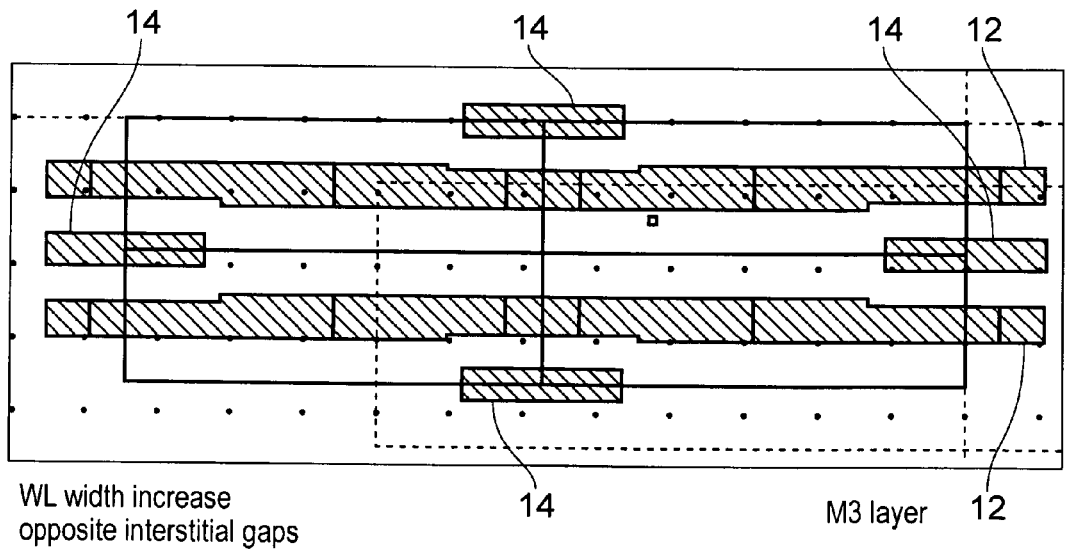
FIG. 5 schematically illustrates the M3 layer within a memory cell.
Figure 6:
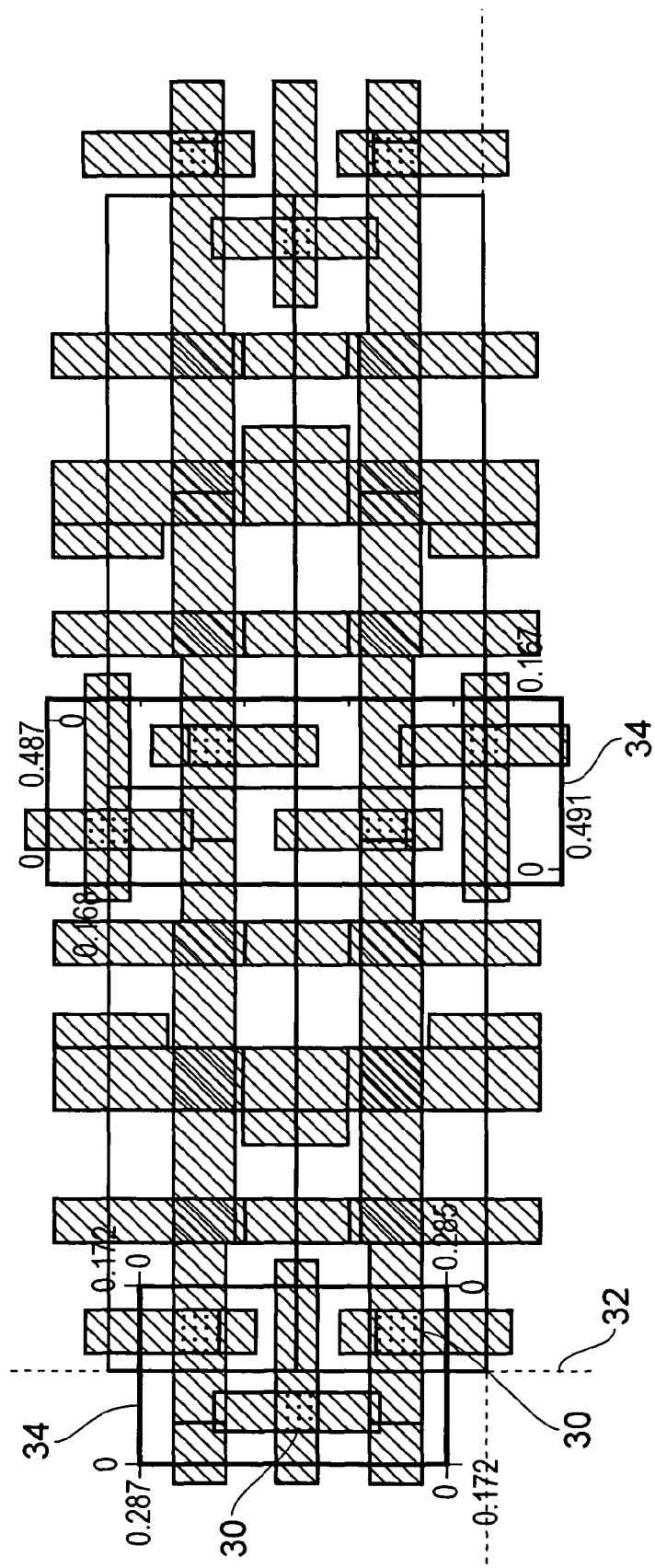
FIG. 6 schematically illustrates the M2 layer, Via2 and M3 layer within a memory cell.

FIGS. 4, 5 and 6 schematically illustrate different layers within a memory cell formed in accordance with one example embodiment of the present technique. FIG. 4 schematically illustrates the M1 metal layer within this memory cell. It will be seen that there are no word lines within this M1 metal layer. FIG. 5 illustrates the M3 metal layer and this includes the word lines 12 and the power line sections 14. As illustrated in FIG. 5, the width of the word lines 12 is increased opposite the interstitial gaps between the power line sections 14. This has the effect of increasing the average width of the word lines 12 thereby reducing their resistance.

FIG. 6 illustrates the M2 metal layer, the Via23 layer (vias extending between the M2 metal layer and the M3 metal layer) and the M3 metal layer within the memory cell containing a two-by two array of bit cells each storing a single data bit. The via spacing constraints may be met by migrating the word lines into the M3 metal layer. A slow down in the action of the word lines may be avoided by the depopulating of the power lines within the M3 metal layer so as to reduce the RC value associated with the word lines.

Figure 7:
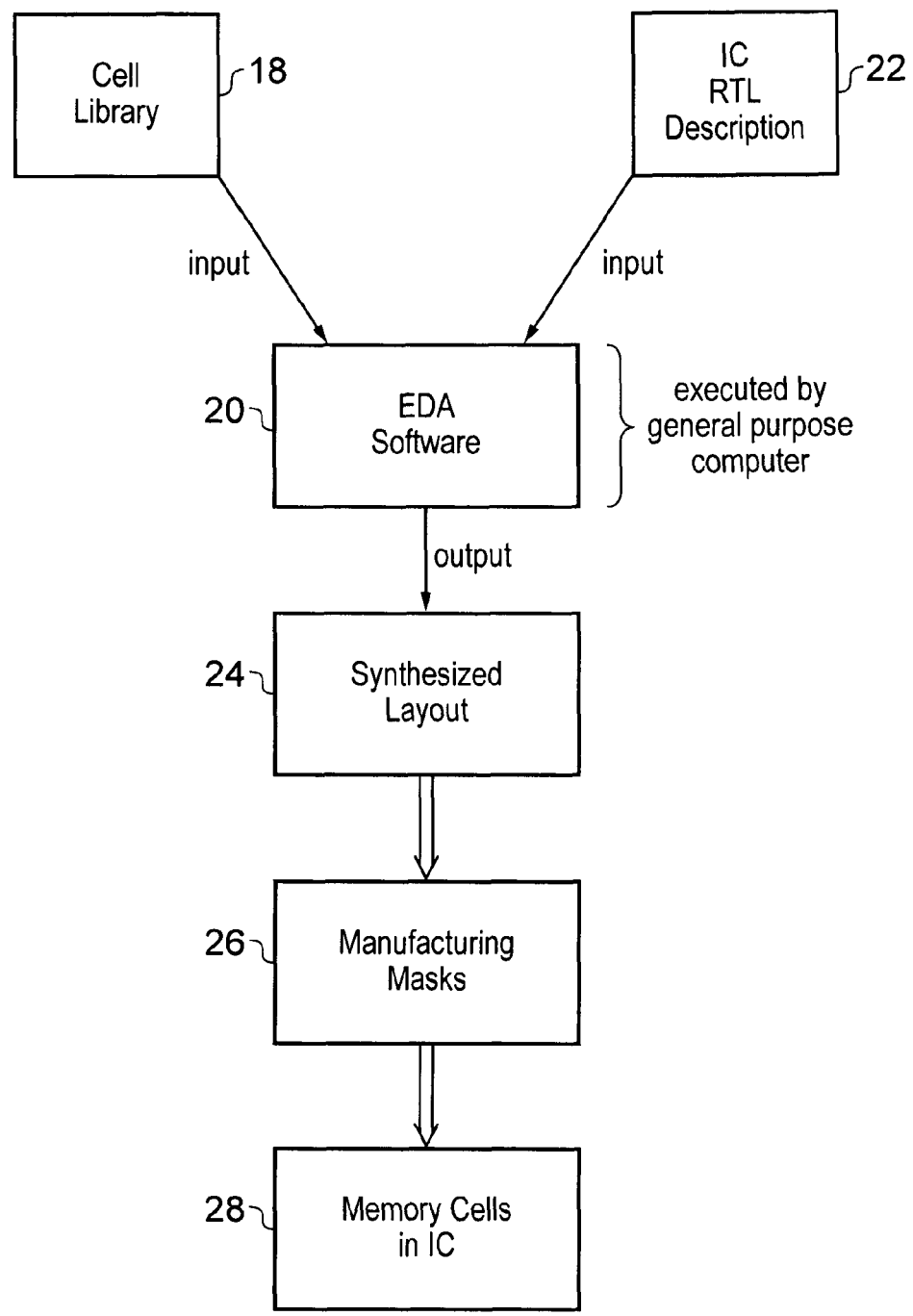
FIG. 7 schematically illustrates manufacturing integrated circuits including memory cells utilising a cell library and a computer software tool to generate a synthesized layout and corresponding manufacturing masks.

The vias 30 of the Via23 layer are disposed offset laterally from and on alternating sides of line 32 extending between nearest neighbour vias 30. This helps increase the via-to-via spacing in a manner that assists in meeting the minimum via spacing constraints (particularly in process geometries of 22 nm and below). The effective interleaving the vias 30 is shown inside the boxes 34 surrounding neighbouring vias 30 within the memory cell FIG. 7 schematically illustrates a cell library 18, which is in the form of a non-transitory computer readable medium (e.g. compact disc or a HDD file) that serves as one input to an electronic design automation tool 20 executed by a general purpose computer. Also input to the EDA tool 20 is a description 22 of an integrated circuit to be manufactured in a language such as register transfer language computer file. The EDA tool 20 forms a synthesised layout 24 corresponding to the RTL description 22 by assembling together different circuit cells from the cell library 18 to provide the functionality defined by the RTL description 22. The cell library 18 includes memory cells formed in accordance with the above described techniques.

The synthesised layout 24 generated by the EDA tool 20 is used to form manufacturing masks 26 which are in turn used within a manufacturing facility to manufacture integrated circuits 28 that include the memory cells as described above.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. A memory cell for storing one of more bits of data, said memory bit cell comprising:
   a substrate; and
   a sequence of metal layers disposed over said substrate, said sequence including at least a first metal layer disposed over and proximal to said substrate, a second metal layer disposed over and proximal to said first metal layer and one or more further metal layers disposed over said second metal layer; wherein
   said one or more further metal layers includes a subject metal layer, said subject metal layer including:
   a word line configured to carry a word line signal for controlling access to said memory cell, said word line extending continuously across said memory bit cell;
   power supply conductors configured to supply electrical power to said memory cell, said power supply conductors having of a plurality of separate power line sections disposed along a line spaced from and parallel to said word line; and
   said sequence of metal layers includes a further metal layer proximal to said subject metal layer and including a plurality of continuous power lines disposed perpendicular to said word line and said plurality of separate power line sections, each of said plurality of separate power line sections being conductively connected to one of said plurality of continuous power lines.

2. A memory cell as claimed in claim 1, wherein said subject metal layer is a third metal layer disposed over and proximal to said second metal layer.

3. A memory cell as claimed in claim 1, wherein said subject metal layer is a third metal layer disposed over and proximal to said second metal layer and said further metal layer is a fourth metal layer disposed over and proximal to said third metal layer.

4. A memory cell as claimed in claim 1, wherein said plurality of separate power line sections disposed along said line are separated by interstitial gaps and said word line has a width perpendicular to said line that is greater adjacent said interstitial gaps than adjacent said plurality of separate word line sections.

5. A memory cell as claimed in claim 4, wherein said interstitial gaps are longer than said plurality of separate power line sections.

6. A memory comprising a plurality of memory cells as claimed in claim 4, wherein said plurality of word lines are interleaved with a plurality of lines of power line sections and said plurality of power line sections are disposed such than power line sections adjacent a first side of a given word line are disposed opposite interstitial gaps between power line sections adjacent a second side of said given word line.

7. A memory cell as claimed in claim 2, wherein said memory cell comprises a two-by-two array of bit cells and vias extending between said second metal layer and said third metal layer are disposed offset from and on alternating sides of a line extending between three or more nearest neighbours among said vias.

8. A method of manufacturing a memory cell for storing one of more bits of data, said method comprising the steps of:
   forming a substrate; and
   forming a sequence of metal layers disposed over said substrate, said sequence including at least a first metal layer disposed over and proximal to said substrate, a second metal layer disposed over and proximal to said first metal layer and one or more further metal layers disposed over said second metal layer; wherein
   said one or more further metal layers includes a subject metal layer, said subject metal layer including:
   a word line configured to carry a word line signal for controlling access to said memory cell, said word line extending continuously across said memory bit cell;
   power supply conductors configured to supply electrical power to said memory cell, said power supply conductors having of a plurality of separate power line sections disposed along a line spaced from and parallel to said word line; and
   said sequence of metal layers includes a further metal layer proximal to said subject metal layer and including a plurality of continuous power lines disposed perpendicular to said word line and said plurality of separate power line sections, each of said plurality of separate power line sections being conductively connected to one of said plurality of continuous power lines.

9. A cell library stored in a non-transitory computer readable form for controlling a computer program executed by a general purpose computer to generate one or more masks for manufacturing a memory cell as claimed in claim 1.

10. A memory cell for storing one of more bits of data, said memory bit cell comprising:
    a substrate; and
    a sequence of metal layers disposed over said substrate, said sequence including at least a first metal layer disposed over and proximal to said substrate, a second metal layer disposed over and proximal to said first metal layer and one or more further metal layers disposed over said second metal layer; wherein
    said one or more further metal layers includes a subject metal layer, said subject metal layer including:
    a word line configured to carry a word line signal for controlling access to said memory cell, said word line extending continuously across said memory bit cell;
    power supply conductors configured to supply electrical power to said memory cell, said power supply conductors having of a plurality of separate power line sections disposed along a line spaced from and parallel to said word line; and
    said plurality of separate power line sections disposed along said line are separated by interstitial gaps and said word line has a width perpendicular to said line that is greater adjacent said interstitial gaps than adjacent said plurality of separate word line sections.

11. A memory cell as claimed in claim 10, wherein said interstitial gaps are longer than said plurality of separate power line sections.

12. A memory comprising a plurality of memory cells as claimed in claim 10, wherein said plurality of word lines are interleaved with a plurality of lines of power line sections and said plurality of power line sections are disposed such than power line sections adjacent a first side of a given word line are disposed opposite interstitial gaps between power line sections adjacent a second side of said given word line.

13. A method of manufacturing a memory cell for storing one of more bits of data, said method comprising the steps of:
    forming a substrate; and
    forming a sequence of metal layers disposed over said substrate, said sequence including at least a first metal layer disposed over and proximal to said substrate, a second metal layer disposed over and proximal to said first metal layer and one or more further metal layers disposed over said second metal layer; wherein said one or more further metal layers includes a subject metal layer, said subject metal layer including:

a word line configured to carry a word line signal for controlling access to said memory cell, said word line extending continuously across said memory bit cell;

power supply conductors configured to supply electrical power to said memory cell, said power supply conductors having of a plurality of separate power line sections disposed along a line spaced from and parallel to said word line; and said plurality of separate power line sections disposed along said line are separated by interstitial gaps and said word line has a width perpendicular to said line that is greater adjacent said interstitial gaps than adjacent said plurality of separate word line sections.

14. A cell library stored in a non-transitory computer readable form for controlling a computer program executed by a general purpose computer to generate one or more masks for manufacturing a memory cell as claimed in claim 10.

15. A memory cell for storing one of more bits of data, said memory bit cell comprising:

a substrate; and a sequence of metal layers disposed over said substrate, said sequence including at least a first metal layer disposed over and proximal to said substrate, a second metal layer disposed over and proximal to said first metal layer and one or more further metal layers disposed over said second metal layer; wherein said one or more further metal layers includes a subject metal layer, said subject metal layer including:

a word line configured to carry a word line signal for controlling access to said memory cell, said word line extending continuously across said memory bit cell;

power supply conductors configured to supply electrical power to said memory cell, said power supply conductors having of a plurality of separate power line sections disposed along a line spaced from and parallel to said word line;

said subject metal layer is a third metal layer disposed over and proximal to said second metal layer; and said memory cell comprises a two-by-two array of bit cells and vias extending between said second metal layer and said third metal layer are disposed offset from and on alternating sides of a line extending between three or more nearest neighbours among said vias.

16. A method of manufacturing a memory cell for storing one of more bits of data, said method comprising the steps of:

forming a substrate; and forming a sequence of metal layers disposed over said substrate, said sequence including at least a first metal layer disposed over and proximal to said substrate, a second metal layer disposed over and proximal to said first metal layer and one or more further metal layers disposed over said second metal layer; wherein said one or more further metal layers includes a subject metal layer, said subject metal layer including:

a word line configured to carry a word line signal for controlling access to said memory cell, said word line extending continuously across said memory bit cell;

power supply conductors configured to supply electrical power to said memory cell, said power supply conductors having of a plurality of separate power line sections disposed along a line spaced from and parallel to said word line;

said subject metal layer is a third metal layer disposed over and proximal to said second metal layer; and said memory cell comprises a two-by-two array of bit cells and vias extending between said second metal layer and said third metal layer are disposed offset from and on alternating sides of a line extending between three or more nearest neighbours among said vias.

17. A cell library stored in a non-transitory computer readable form for controlling a computer program executed by a general purpose computer to generate one or more masks for manufacturing a memory cell as claimed in claim 15.

* * * * *